US010566123B2

(12) United States Patent
Sugiyama et al.

(10) Patent No.: US 10,566,123 B2
(45) Date of Patent: Feb. 18, 2020

(54) LINEAR SOLENOID DRIVING DEVICE

(71) Applicants: AISIN AW CO., LTD., Anjo-shi, Aichi-ken (JP); TOSHIBA ELECTRONIC DEVICES & STORAGE CORPORATION, Tokyo (JP)

(72) Inventors: Hiroyuki Sugiyama, Nishio (JP); Toshio Shiramatsu, Yokohama (JP)

(73) Assignees: AISIN AW CO., LTD., Anjo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/080,801

(22) PCT Filed: Mar. 30, 2017

(86) PCT No.: PCT/JP2017/013204
§ 371 (c)(1),
(2) Date: Aug. 29, 2018

(87) PCT Pub. No.: WO2017/170848
PCT Pub. Date: Oct. 5, 2017

(65) Prior Publication Data
US 2019/0074122 A1     Mar. 7, 2019

(30) Foreign Application Priority Data

Mar. 30, 2016   (JP) .................................. 2016-069089

(51) Int. Cl.
*H01F 7/18*     (2006.01)
*G01R 1/20*     (2006.01)
(Continued)

(52) U.S. Cl.
CPC ............... *H01F 7/18* (2013.01); *G01R 1/203* (2013.01); *G01R 19/16552* (2013.01);
(Continued)

(58) Field of Classification Search
CPC ...... G05F 1/575; H02M 3/156; H02M 3/1588
(Continued)

(56) References Cited

U.S. PATENT DOCUMENTS

| 5,951,616 A | 9/1999 | Chiba et al. | |
|---|---|---|---|
| 2005/0002143 A1* | 1/2005 | Satoh | G01R 1/203 361/93.1 |
| 2007/0288188 A1* | 12/2007 | Kahr | H01F 7/18 702/104 |
| 2012/0182003 A1* | 7/2012 | Flaibani | H02M 3/156 323/284 |

(Continued)

FOREIGN PATENT DOCUMENTS

| DE | 102006019681 A1 | 11/2007 |
|---|---|---|
| DE | 102016103141 A1 | 8/2016 |

(Continued)

OTHER PUBLICATIONS

Jun. 13, 2017 Search Report issued in International Patent Application No. PCT/JP017/013204.

*Primary Examiner* — Gary A Nash
(74) *Attorney, Agent, or Firm* — Oliff PLC

(57) ABSTRACT

A linear solenoid driving device that drives a linear solenoid, the linear solenoid driving device includes a driving circuit that performs switching control over a switching element connected to the linear solenoid based on a driving command; a current detection circuit that has a detection resistor which is connected to the switching element and the linear solenoid, and detects a current, and an operational amplifier which amplifies a voltage across both ends of the detection resistor and outputs the amplified voltage; a reference voltage output circuit that outputs a reference voltage which has a same temperature characteristic as an output voltage of the operational amplifier; and a control unit.

4 Claims, 3 Drawing Sheets

(51) Int. Cl.
 *G01R 19/165* (2006.01)
 *G05F 1/46* (2006.01)
 *H02M 3/156* (2006.01)
 *H02M 3/158* (2006.01)
 *G05F 1/575* (2006.01)
 *G05F 3/16* (2006.01)

(52) U.S. Cl.
 CPC .............. *G05F 1/461* (2013.01); *G05F 1/463* (2013.01); *G05F 1/575* (2013.01); *G05F 3/16* (2013.01); *H02M 3/156* (2013.01); *H02M 3/1588* (2013.01)

(58) Field of Classification Search
 USPC .................................. 323/277, 280, 283–285
 See application file for complete search history.

(56) References Cited

U.S. PATENT DOCUMENTS

2014/0375290 A1* 12/2014 Mizuno ................. H02M 3/156
 323/282
2016/0246314 A1  8/2016 Hausmann

FOREIGN PATENT DOCUMENTS

| JP | H09-280411 A | 10/1997 |
| JP | 2007-276702 A | 10/2007 |
| JP | 2008-216262 A | 9/2008 |
| JP | 2009-193185 A | 8/2009 |
| JP | 2014-175456 A | 9/2014 |
| WO | 82/02794 A1 | 8/1982 |

\* cited by examiner

LINEAR SOLENOID DRIVING DEVICE

BACKGROUND

The disclosure disclosed in the disclosure in the specification relates to a linear solenoid driving device.

A linear solenoid driving device has been conventionally proposed as a kind of linear solenoid driving device that includes: a PWM signal generation unit that generates PWM signals based on a controlled current target value from a microcomputer; a solenoid driving circuit that outputs linear solenoid driving signals due to PWM signals from the PWM signal generation unit; a solenoid driving transistor that is operated by the driving signals from the solenoid driving circuit and that drives a linear solenoid; an electric monitor that detects a driving current flowing through the linear solenoid and provides feedback; and an error correction unit that corrects errors between an output value of the current monitor and the control current target value (for example, refer to Japanese Patent Application Publication No. 2007-276702). In the linear solenoid driving device of Japanese Patent Application Publication No. 2007-276702, the PWM signal generation unit, the solenoid driving circuit, the solenoid driving transistor, the current monitor, and the error correction unit are structured of one chip driver IC.

SUMMARY

As described above, it is possible to reduce the size of the linear solenoid driving device by putting the components together into one chip. However, there are cases in which the temperature of the current monitor increases due to effects of heat generated by the solenoid driving transistor being driven. Thus, there are cases in which the output value of the current monitor decreases due to a temperature characteristic of the current monitor and so the driving current flowing through the linear solenoid cannot be accurately detected.

An exemplary aspect of the disclosure accurately detects the driving current flowing through the linear solenoid and improves the controllability of feedback control, even when the current detection circuit is affected by heat.

The linear solenoid driving device of the disclosure is a linear solenoid driving device that drives a linear solenoid, the linear solenoid driving device including: a driving circuit that performs switching control over a switching element connected to the linear solenoid based on a driving command; a current detection circuit that has a detection resistor which is connected to the switching element and the linear solenoid, and detects a current, and an operational amplifier which amplifies a voltage across both ends of the detection resistor and outputs the amplified voltage; a reference voltage output circuit that outputs a reference voltage which has a same temperature characteristic as an output voltage of the operational amplifier; and a control unit that is configured to receive the output voltage and the reference voltage, calculate a driving current flowing through the linear solenoid from the output voltage of which a temperature characteristic is corrected based on the reference voltage, generate the driving command by feedback control so that the calculated driving current becomes a prescribed target current, and output the driving command to the driving circuit.

The linear solenoid driving device has the current detection circuit that has the operational amplifier which amplifies the voltage across both ends of the detection resistor for detecting the current and outputs the amplified voltage. The linear solenoid driving device also has the reference voltage output circuit configured of elements so that the reference voltage which has the same temperature characteristic as the output voltage of the operational amplifier is output. In the linear solenoid driving device, the driving current flowing through the linear solenoid is calculated from the output voltage of which the temperature characteristic is corrected based on the reference voltage, and the driving command is generated by the feedback control so that the calculated driving current becomes the prescribed target current and is output to the driving circuit. Thus, even if the output voltage of the operational amplifier varies due to the effect of the heat generated by driving the switching element, the driving current flowing through the linear solenoid can be accurately detected and the controllability of the feedback control can be improved.

DETAILED DESCRIPTION OF EMBODIMENTS

Modes for carrying out the disclosure of the present disclosure will be described below with reference to the accompanying drawings.

Figure 1:
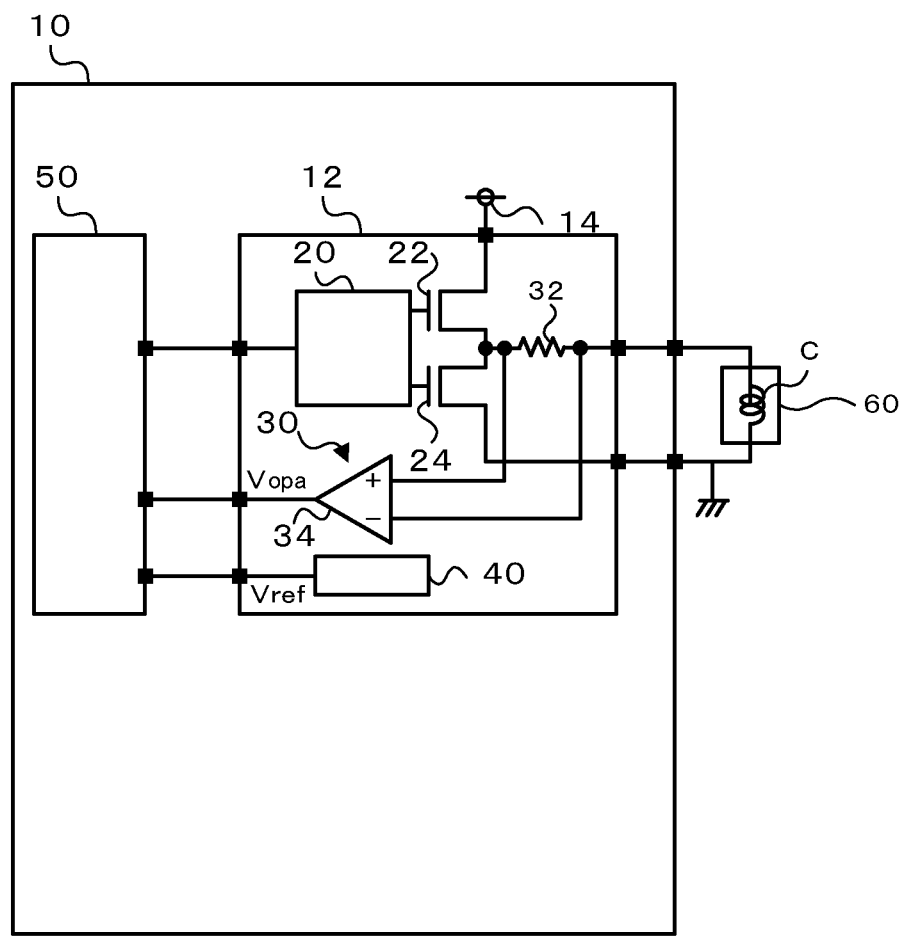
FIG. 1 is a diagram of a schematic configuration of an electronic control unit according to an embodiment of the disclosure.

FIG. 1 is a diagram of a schematic configuration of an electronic control unit 10 according to an embodiment of the disclosure. The electronic control unit 10 in the embodiment is configured to drive a linear solenoid 60 that controls hydraulic pressure to be supplied to a clutch or a brake assembled in the automatic transmission of the vehicle, for example.

The electronic control unit 10 includes: a driving circuit (driver) 20 that applies a driving current to a coil C of the linear solenoid 60 due to switching control of a switching element; a current detection circuit 30 that detects the driving current flowing through the coil C of the linear solenoid 60; a reference voltage output circuit 40 that outputs a prescribed reference voltage Vref; and a microcomputer 50 that includes a CPU, a ROM, and a RAM etc. that are not shown, and that performs feedback control so that the driving current flowing through the coil C of the linear solenoid 60 becomes a target current. In the embodiment, the driving circuit 20, the current detection circuit 30, and the reference voltage output circuit 40 are integrated into one chip 12 and are formed into one chip.

The driving circuit 20 is configured to control driving of a first transistor 22 that is a switching element connected to a direct current power source 14 and one end of the coil C, and a second transistor 24 that is a switching element connected to a connection point of the first transistor 22 and the one end of the coil C and connected to the other end of the coil C. The driving circuit 20 performs switching control over the first and second transistors 22, 24 based on a driving command output from the microcomputer 50. Switching control is performed over the first transistor 22 so that the driving current that is flowing through the coil C of the linear solenoid 60 becomes the target current. Switching control is performed over the second transistor 24 so that counter electromotive force generated in the coil C when the first transistor 22 is switched off circulates.

The current detection circuit 30 has a detection resistor 32 that is connected in series in between the first transistor 22 and the one end of the coil C, and an operational amplifier 34 in which the connection point of the first transistor 22 and the detection resistor 32 is connected to a non-inverted input terminal while the connection point of the detection resistor 32 and the one end of the coil C is connected to the inverted input terminal. The current detection circuit 30 is a circuit in which the voltage across both ends of the detection resistor 32 are amplified by the operational amplifier 34 and the amplified voltage is output to the microcomputer 50 as an output voltage Vopa. The driving current flowing through the coil C can be detected by the output voltage Vopa. Here, if the temperature of the detection resistor 32 and the operational amplifier 34 of the current detection circuit 30 increases (changes) with the heat generated due to performing switching control over the first and second transistors 22, 24 of the driving circuit 20, the output voltage Vopa may change as a result of temperature characteristics of the detection resistor 32 and the operational amplifier 34.

Figure 2:
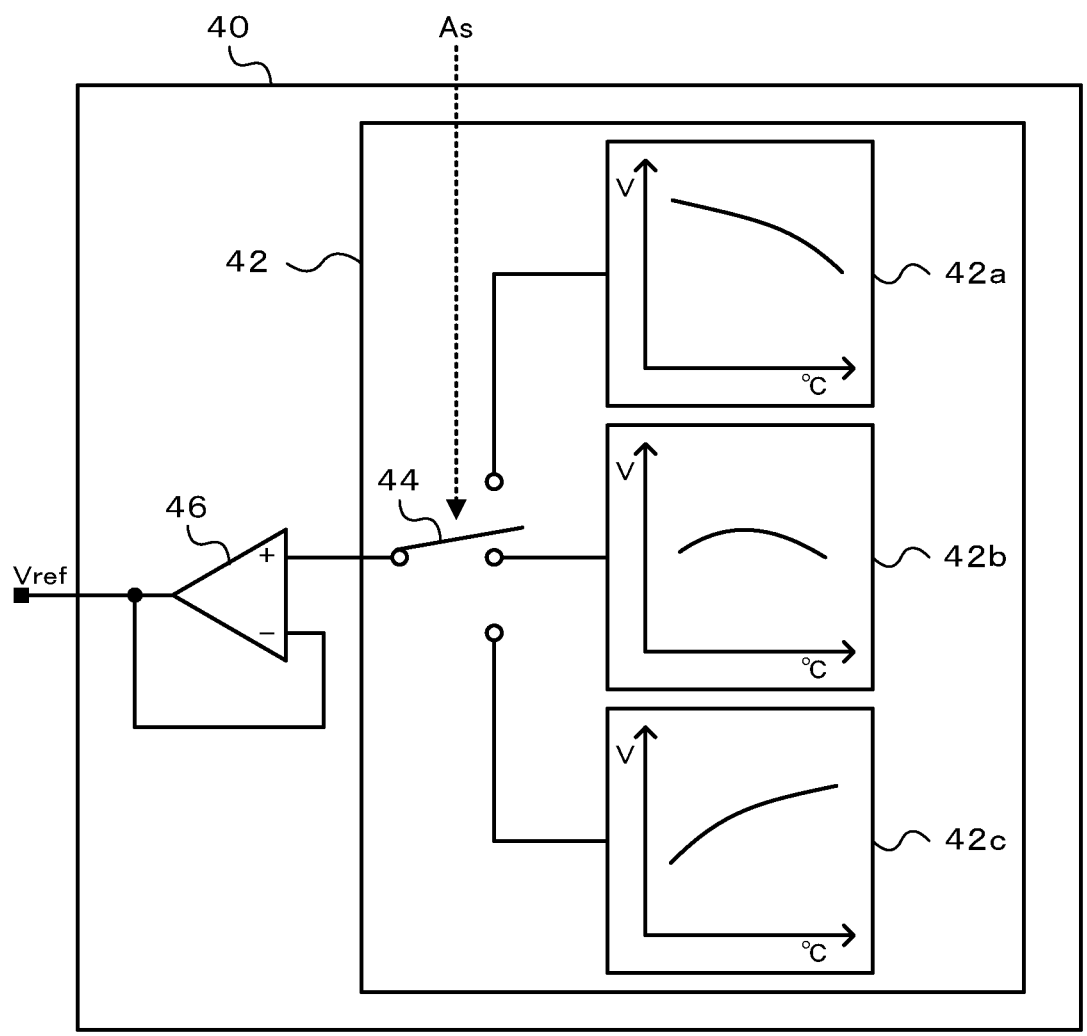
FIG. 2 is a diagram of a schematic configuration of a reference voltage output circuit.

The reference voltage output circuit 40 is configured to output the reference voltage Vref for correcting the change in output of the output voltage Vopa of the operational amplifier 34 caused by the change in temperature of the current detection circuit 30. FIG. 2 is a diagram of a schematic configuration of the reference voltage output circuit 40. The reference voltage output circuit 40 of the embodiment has a band gap reference circuit 42 that uses a band gap voltage which is a physical property of silicon of the semiconductor material, and an operational amplifier 46 that receives the output voltage from the band gap reference circuit 42 at a non-inverted input terminal and amplifies the voltage to output the voltage as the reference voltage Vref. The output of the operational amplifier 46 is returned to an inverted input terminal of the operational amplifier 46.

Figure 3:
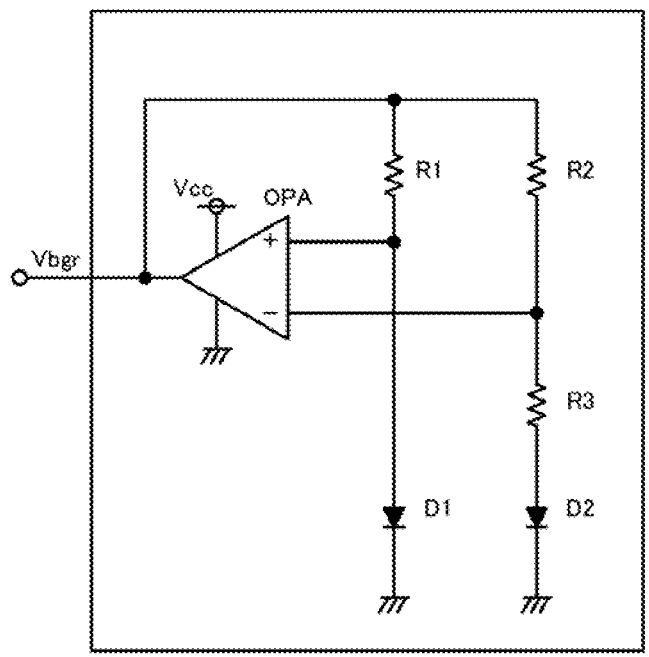
FIG. 3 is a diagram of an example of a basic configuration of a band gap reference circuit.

Here, a band gap reference circuit is a known circuit of which various configurations are possible. FIG. 3 shows an example of a basic configuration of a band gap reference circuit. The basic configuration of this type is described in the Japanese Patent Application Publication No. 2014-98984 (JP 2014-98984 A), for example. The band gap reference circuit 42 of the embodiment is not limited to this configuration. As shown in FIG. 3, the band gap reference circuit is configured of diodes D1, D2, resistors R1 to R3, and an operational amplifier OPA, for example. In the JP 2014-98984 A, an output voltage Vbgr of the band gap reference circuit is given by the following formula (1). "Vbe1" is the forward voltage of the pn junction diode D1 and has a negative temperature dependency in which the voltage decreases as the temperature increases. "q" is the charge of electrons, "k" is the Boltzmann constant, and "T" is the absolute temperature.

$$Vbgr = Vbe1 + (kT/q) \cdot [\ln(R2/R1)] \cdot (R2/R3) \quad (1)$$

Usually, the band gap reference circuit can make the output voltage Vbgr not depend on the change in temperature by appropriately selecting the resistors R1, R2, R3 and the diodes D1, D2 so that the change in the "Vbe1" in the first term on the right side is canceled out by the second term on the right side that has a positive temperature dependency. In contrast, the band gap reference circuit 42 of the embodiment is configured so that the output voltage Vbgr is dependent on the change in temperature. In the basic configuration of the band gap reference circuit in FIG. 3, the output voltage Vbgr can be provided with temperature characteristics by appropriately adjusting the resistance values of the resistors R1, R2, R3 included in the second term on the right side of formula (1) and increasing and decreasing the positive temperature dependency in the second term on the right side.

The band gap reference circuit 42 in the embodiment has a circuit configuration (output voltage circuit), of which the details are not shown, that selectively realizes a plurality (for example, three variations) of temperature characteristics, by combining the semiconductor elements such as the diodes and the transistors and the resistors. For example, as shown by the relationship diagrams of the temperature (° C.) and the output voltage (V) in FIG. 2, the band gap reference circuit 42 has a circuit configuration 42a in which the output voltage decreases as the temperature changes from a low temperature to a high temperature, a circuit configuration 42b in which the output voltage increases as the temperature increases up to a certain temperature and the output voltage decreases as the temperature increases past the certain temperature, and a circuit configuration 42c in which the output voltage increases as the temperature changes from a low temperature to a high temperature. The band gap reference circuit 42 has a selection switching part 44 that selectively switches to any one of the circuit configurations 42a to 42c and connects the selected circuit configuration to the non-inverted input terminal of the operational amplifier 46. When the driving circuit 20, the current detection circuit 30, and the reference voltage output circuit 40 are formed into one chip, the selection switching part 44 receives an input of an adjustment signal As (switching signal) and is fixed in a state in which one of the circuit configurations 42a to 42c are selected. The adjustment signals As are signals that cause the band gap reference circuit 42 to select the circuit configuration that has the temperature characteristic closest to the current detection circuit 30 (output voltage Vopa) provided within the same chip 12 out of the circuit configurations 42a to 42c of the reference voltage output circuit 40. Thus, the reference voltage output circuit 40 outputs to the microcomputer 50, the reference voltage Vref that has the temperature characteristic closest to the current detection circuit 30 (output voltage Vopa) disposed within the same chip 12. In this way, the microcomputer 50 uses the output reference voltage Vref as a temperature characteristic correction coefficient for the output voltage Vopa.

Figure 4:
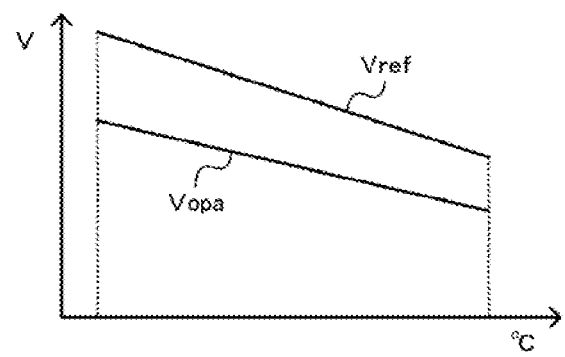
FIG. 4 is an explanatory diagram of an example of a relationship between an output voltage Vopa and a reference voltage Vref.

In the electronic control unit 10 configured in this way, the following feedback control is performed. First, the microcomputer 50 sets the target current that needs to be supplied to the coil C of the linear solenoid 60 based on a shift speed of the automatic transmission, an accelerator operation amount, and a vehicle speed. The microcomputer 50 receives the output voltage Vopa of the operational amplifier 34 of the current detection circuit 30 and the reference voltage Vref of the reference voltage output circuit 40. Here, FIG. 4 is an explanatory diagram of an example of the relationship between the output voltage Vopa and the reference voltage Vref. FIG. 4 shows how the output voltage Vopa changes as the temperature changes regardless of what voltage is desired to be output as the output voltage Vopa. For example, the output voltage Vopa tends to decrease as the temperature increases. Since the reference voltage Vref that has the temperature characteristic close to the output voltage Vopa (here, the circuit configuration 42a in FIG. 2, for example) is selected, the reference voltage Vref tends to decrease as the temperature increases so as to follow the output voltage Vopa. The microcomputer 50 corrects the temperature characteristic of the output voltage Vopa based on the reference voltage Vref that has the same temperature characteristic as the output voltage Vopa. The microcomputer 50 then calculates (detects) the driving current that is flowing through the coil C of the linear solenoid 60 from the output voltage after correction. The correction of the temperature characteristic is performed by dividing the output voltage Vopa by the reference voltage Vref. After the driving current is calculated in this way, the driving current and the target current are compared and a target duty ratio (for example, the ratio of the amount of time the first transistor 22 is on to the sum of the amount of time the first transistor 22 is on and the amount of time the first transistor 22 is off) is set by the feedback control so that the driving current becomes closer to the target current. Then, the driving command at the target duty ratio is output to the driving circuit 20 so that the driving circuit 20 performs switching control.

In the electronic control unit 10 of the disclosure described above, the electronic control unit 10 has the reference voltage output circuit 40 that outputs the reference voltage Vref having the same temperature characteristic as the output voltage Vopa of the operational amplifier 34 of the current detection circuit 30. The electronic control unit 10 calculates the driving current flowing through the linear solenoid 60 from the output voltage Vopa of which the temperature characteristic was corrected based on the reference voltage Vref, and generates the driving command by the feedback control so that the calculated driving current becomes the prescribed target current. The electronic control unit 10 then outputs the driving command to the driving circuit 20 and performs switching control. Thus, even if the output voltage Vopa varies due to the effects of the heat generated by switching of the first and second transistors 22, 24, the output voltage Vopa can be corrected based on the reference voltage Vref, and the driving current flowing through the linear solenoid 60 can be accurately detected (calculated). Therefore, the controllability of the feedback control can be improved.

In the electronic control unit 10 of the disclosure, the driving circuit 20, the current detection circuit 30 (operational amplifier 34), and the reference voltage output circuit 40 are integrated into the chip 12 and are formed into one chip. Thus, when heat is generated due to switching control of the first and second transistors 22, 24, the same change in temperature occurs in the current detection circuit 30 and the reference voltage output circuit 40. The temperature characteristic of the output voltage Vopa can thus be corrected and the driving current can be accurately detected, without a temperature sensor that detects the temperature of the current detection circuit 30 being provided. Therefore, the controllability of the feedback control can be further improved. Compared to when the components are each mounted to a circuit board of the electronic control unit 10, it is possible to reduce the amount of resin molds needed for mounting the components on the circuit board and wiring for connecting the components together. Thus, it is possible to reduce the size of the circuit board of the electronic control unit 10 and improve the controllability of the feedback control.

In the electronic control unit 10 of the disclosure, the reference voltage output circuit 40 includes the band gap reference circuit 42. Thus, it is possible to output the reference voltage Vref that has the desired temperature characteristic with a relatively simple configuration.

Additionally, in the electronic control unit 10 of the disclosure, the reference voltage output circuit 40 is configured to realize a plurality of the temperature characteristics. Thus, it is possible to make the reference voltage output circuit 40 versatile as well as easily output the reference voltage Vref having a temperature characteristic that is close to the temperature characteristic of the current detection circuit 30 (output voltage Vopa). The circuit configurations 42a to 42c are selected when the driving circuit 20, the current detection circuit 30, and the reference voltage output circuit 40 are formed into one chip. Thus, the correction accuracy of the temperature characteristic can be assured by the chip 12 alone. Therefore, during a step in which the chip 12 is installed in the electronic control unit 10, there is no need to adjust the temperature characteristics in a high temperature environment or a low temperature environment.

In the electronic control unit 10 of the disclosure, the driving circuit 20, the current detection circuit 30 (operational amplifier 34), and the reference voltage output circuit 40 are integrated into one chip 12 and are formed into one chip. However, the electronic control unit 10 is not limited to this, and the above components need not be formed into one chip.

In the electronic control unit 10 of the disclosure, one of the circuit configurations 42a to 42c of the reference voltage output circuit 40 is selected (fixed) when the driving circuit 20, the current detection circuit 30 (operational amplifier 34), and the reference voltage output circuit 40 are formed into one chip. However, the timing of the selection is not limited to this. For example, the circuit configuration may be selected during the step in which the chip 12 is installed in the electronic control unit 10. The band gap reference circuit of the reference voltage output circuit 40 is not limited to a circuit that has the circuit configurations 42a to 42c, but may also be a circuit that only has the circuit configuration corresponding to the temperature characteristic of the current detection circuit 30 installed on the same chip 12.

In the electronic control unit 10 of the disclosure, the reference voltage output circuit 40 has the band gap reference circuit. However, the electronic control unit 10 is not limited to this, and may have any circuit configured of elements that can output the reference voltage Vref with the same temperature characteristic as the output voltage Vopa of the operational amplifier 34.

In the electronic control unit 10 of the disclosure, the temperature characteristic of the output voltage Vopa is corrected by using the reference voltage Vref as it is. However, the electronic control unit 10 is not limited to this. For example, a map that sets the relationship of the reference voltage Vref and the temperature correction coefficient may be recorded in the ROM of the microcomputer 50 etc., the temperature correction coefficient may be derived from the input reference voltage Vref, and the temperature characteristic of the output voltage Vopa may be corrected using the derived temperature correction coefficient.

As described above, the linear solenoid driving device (10) of the disclosure is a linear solenoid driving device (10) that controls driving of the linear solenoid (60), including: the driving circuit (20) that performs switching control of the switching element (22) connected to the linear solenoid (60) based on the driving command; the detection resistor (32) which is connected to the switching element (22) and the linear solenoid (60), and detects the current; the current detection circuit (30) that has the operational amplifier (34) which amplifies the voltage across both ends of the detection resistor (32) and outputs the amplified voltage; the reference voltage output circuit (40) that outputs the reference voltage so that the temperature characteristic is the same as the output voltage of the operational amplifier (34); and the control unit (50) that receives the output voltage and the reference voltage, that calculates the driving current flowing through the linear solenoid (60) from the output voltage of which the temperature characteristic is corrected based on the reference voltage, that generates the driving command so that the calculated driving current becomes the prescribed target current, and that outputs the driving command to the driving circuit (20).

Thus, even if the output voltage of the operational amplifier (34) in the current detection circuit (30) varies due to the effects of the heat generated by the driving of the switching element (22), it is possible to correct the output voltage based on the reference voltage that has the same temperature characteristic as the output voltage and to appropriately detect the driving current flowing through the linear solenoid (60). Thus, it is possible to accurately detect the driving current flowing through the linear solenoid (60) to improve the controllability of the feedback control.

In the linear solenoid driving device (10), the driving circuit (20), the current detection circuit (30), and the reference voltage output circuit (40) may be mounted on one chip (12). Thus, compared to when the components are each mounted on the circuit board of the linear solenoid driving device, it is possible to reduce the amount of resin molds needed for mounting the components on the circuit board and the wiring for connecting the components together. Thus, it is possible to reduce the size of the circuit board of the linear solenoid driving device and improve the controllability of the feedback control.

The reference voltage output circuit (40) may include the band gap reference circuit (42).

The reference voltage output circuit (40) may be configured to be capable of outputting various voltages with different temperature characteristics by switching the circuit configuration of the band gap reference circuit (42) so as to selectively output the voltage corresponding to the temperature characteristic of the output voltage as the reference voltage.

Here, the correspondence between the main elements of the above embodiment and the main elements of the disclosure of the disclosure described in the "SUMMARY" section will be described. In the embodiment described above, the driving circuit 20 corresponds to the "driving circuit", the current detection circuit 30 that has the detection resistor 32 and the operational amplifier 34 corresponds to the "current detection circuit", the reference voltage output circuit 40 corresponds to the "reference voltage output circuit", and the microcomputer 50 corresponds to the "control unit".

It should be understood that the disclosure of the present disclosure is not limited in any way to the above embodiments, and various modifications can be made within the spirit and scope of the present disclosure. Furthermore, the embodiment described above is merely a specific form of the disclosure described in the "SUMMARY" section, and does not limit the elements of the disclosure described in the "SUMMARY" section.

INDUSTRIAL APPLICABILITY

The disclosure of the disclosure is applicable to the manufacturing industry of linear solenoid driving devices.

The invention claimed is:

1. A linear solenoid driving device that drives a linear solenoid, the linear solenoid driving device comprising:
   a driving circuit that performs switching control over a switching element connected to the linear solenoid based on a driving command;
   a current detection circuit that has a detection resistor which is connected to the switching element and the linear solenoid, and detects a current, and an operational amplifier which amplifies a voltage across both ends of the detection resistor and outputs the amplified voltage;
   a reference voltage output circuit that outputs a reference voltage from one of a plurality temperature characteristics, wherein:
     the plurality of temperature characteristics includes at least a first temperature characteristic in which voltage decreases as temperature increases and a second temperature characteristic in which voltages increases as the temperature increases; and
     the one of the plurality of temperature characteristics of the reference voltage and a temperature characteristic in which voltage changes as the temperature increases of an output voltage of the operational amplifier are a same temperature characteristic; and
   a control unit that is configured to:
     receive the output voltage and the reference voltage,
     calculate a driving current flowing through the linear solenoid from the output voltage that is corrected based on the reference voltage,
     generate the driving command by feedback control so that the calculated driving current becomes a prescribed target current, and
     output the driving command to the driving circuit.

2. The linear solenoid driving device according to claim 1, wherein
   the driving circuit, the current detection circuit, and the reference voltage output circuit are installed in one chip.

3. The linear solenoid driving device according to claim 1, wherein
   the reference voltage output circuit includes a band gap reference circuit.

4. The linear solenoid driving device according to claim 3, wherein
   the reference voltage output circuit is configured to be capable of outputting various voltages with different temperature characteristics by switching a circuit configuration of the band gap reference circuit so as to selectively output a voltage corresponding to the temperature characteristic of the output voltage as the reference voltage.

* * * * *